(12) United States Patent
Cho

(10) Patent No.: US 9,401,205 B2
(45) Date of Patent: Jul. 26, 2016

(54) ELECTRONIC DEVICE

(71) Applicant: SK HYNIX INC., Icheon (KR)

(72) Inventor: Kwang-Hee Cho, Icheon (KR)

(73) Assignee: SK HYNIX INC., Icheon (KR)

( * ) Notice: Subject to any disclaimer, the term of this patent is extended or adjusted under 35 U.S.C. 154(b) by 78 days.

(21) Appl. No.: 14/459,573

(22) Filed: Aug. 14, 2014

(65) Prior Publication Data

US 2015/0332766 A1 Nov. 19, 2015

(30) Foreign Application Priority Data

May 19, 2014 (KR) .......................... 10-2014-0059560

(51) Int. Cl.
| | | |
|---|---|---|
| *G11C 13/00* | (2006.01) | |
| *G06F 3/06* | (2006.01) | |
| *G06F 12/08* | (2016.01) | |

(52) U.S. Cl.
CPC ............ *G11C 13/0069* (2013.01); *G06F 3/061* (2013.01); *G06F 3/0659* (2013.01); *G06F 3/0679* (2013.01); *G06F 12/0831* (2013.01); *G11C 13/003* (2013.01); *G11C 13/0097* (2013.01); *G06F 2206/1014* (2013.01); *G06F 2212/621* (2013.01); *G11C 2013/0073* (2013.01); *G11C 2213/15* (2013.01); *G11C 2213/72* (2013.01); *G11C 2213/74* (2013.01); *G11C 2213/76* (2013.01)

(58) Field of Classification Search
CPC ............ G11C 13/0097; G06F 12/0831; G06F 3/0659; G06F 3/061; G06F 3/0679
USPC ............................................................ 710/5
See application file for complete search history.

(56) References Cited

U.S. PATENT DOCUMENTS

| | | | |
|---|---|---|---|
| 9,159,418 B1* | 10/2015 | Ward ................... | H01L 51/0591 |
| 2012/0127779 A1* | 5/2012 | Scheuerlein ............. | G11C 5/02 365/148 |
| 2014/0091273 A1* | 4/2014 | Lin ..................... | G11C 13/0007 257/4 |
| 2015/0006786 A1* | 1/2015 | Cabrera et al. ................. | 711/103 |
| 2015/0325289 A1* | 11/2015 | Castro ........................... | 365/148 |

FOREIGN PATENT DOCUMENTS

| | | |
|---|---|---|
| KR | 10-2011-0070538 A | 6/2011 |
| KR | 10-2012-0059195 A | 6/2012 |

* cited by examiner

*Primary Examiner* — Idriss N Alrobaye
*Assistant Examiner* — Brooke Taylor

(57) ABSTRACT

An electronic device includes a semiconductor memory unit. The semiconductor memory unit includes a plurality of first lines extending in a first direction, a plurality of second lines extending in a second direction crossing the first direction, and a plurality of memory cells provided between the first lines and the second lines at intersections of the first lines and the second lines. Each of the memory cells includes a variable resistance element coupled to and disposed between a corresponding second line and first and second selection elements, the first selection element coupled to and disposed between the variable resistance element and a corresponding first line, and the second selection element coupled to and disposed between the variable resistance element and the corresponding first line. The first selection element allows a bidirectional current flow therethrough, and the second selection element allows a unidirectional current flow therethrough.

12 Claims, 12 Drawing Sheets

US 9,401,205 B2

ELECTRONIC DEVICE

CROSS-REFERENCE TO RELATED APPLICATION

The present application claims priority of Korean Patent Application No. 10-2014-0059560, entitled "ELECTRONIC DEVICE" and filed on May 19, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which a sneak current is reduced in a memory device having a cross-point structure.

In one aspect, an electronic device includes a semiconductor memory unit that includes: a plurality of first lines which are extended in a first direction; a plurality of second lines which are extended in a second direction crossing the first direction; and a plurality of memory cells which are provided between the first lines and the second lines at intersections of the first lines and the second lines, wherein each of the memory cells comprising: a variable resistance element which includes one end coupled to a corresponding second line and the other end coupled to first and second selection elements; the first selection element which includes one end coupled to the variable resistance element and the other end coupled to a corresponding first line, and allows a bidirectional current flow; and the second selection element which includes one end coupled to the variable resistance element and the other end coupled to the corresponding first line, and allows a unidirectional current flow.

Implementations of the above device may include one or more of the following.

Each of the first and second selection elements is connected with the variable resistance element in series, and the first and second selection elements are connected with each other in parallel. When a direction from the variable resistance element to the first and second selection elements is a first direction, and a direction from the first and second selection elements to the variable resistance element is a second direction, the second selection element blocks a current flow in the second direction. The first and second selection elements allow a current flow in the first direction. When a set voltage and a set current during a set operation where a resistance state of the variable resistance element is changed from a high resistance state to a low resistance state, and a reset voltage and a reset current during a reset operation where a resistance state of the variable resistance element is changed from the low resistance state to the high resistance state have different polarities, respectively, and a magnitude of the set current is larger than that of the reset current, the second selection element allows a current flow only at a voltage having a same polarity as the set voltage. When a set voltage and a set current during a set operation where a resistance state of the variable resistance element is changed from a high resistance state to a low resistance state, and a reset voltage and a reset current during a reset operation where a resistance state of the variable resistance element is changed from the low resistance state to the high resistance state have different polarities, respectively, and a magnitude of the reset current is larger than that of the set current, the second selection element allows a current flow only at a voltage having a same polarity as the reset voltage. The first selection element includes a MIT (Metal Insulator Transition) element, a MIEC (Mixed Ion-Electron Conducting) element, or an OTS (Ovonic Threshold Switching) element, and the second selection element includes a diode.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

These and other aspects, implementations and associated advantages are described in greater detail in the drawings, the description and the claims.

DETAILED DESCRIPTION

Figure 1A:
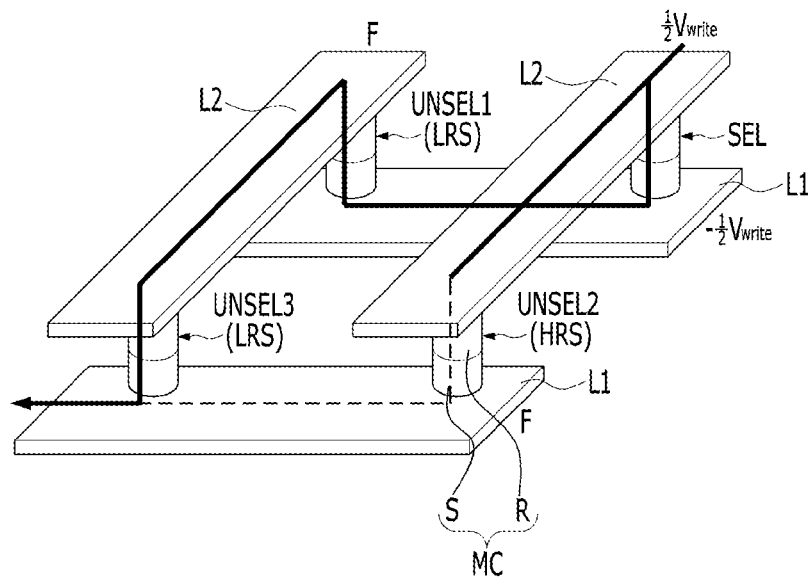
FIGS. 1A to 1E are views illustrating a memory device and a method for operating the same in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Embodiments of the present disclosure are directed to a memory device having a cross-point structure in which memory cells are disposed at cross points of first lines and second lines crossing the first lines. Each memory cell includes a selection element coupled to a variable resistance element in order to block a sneak current.

Figure 1B:
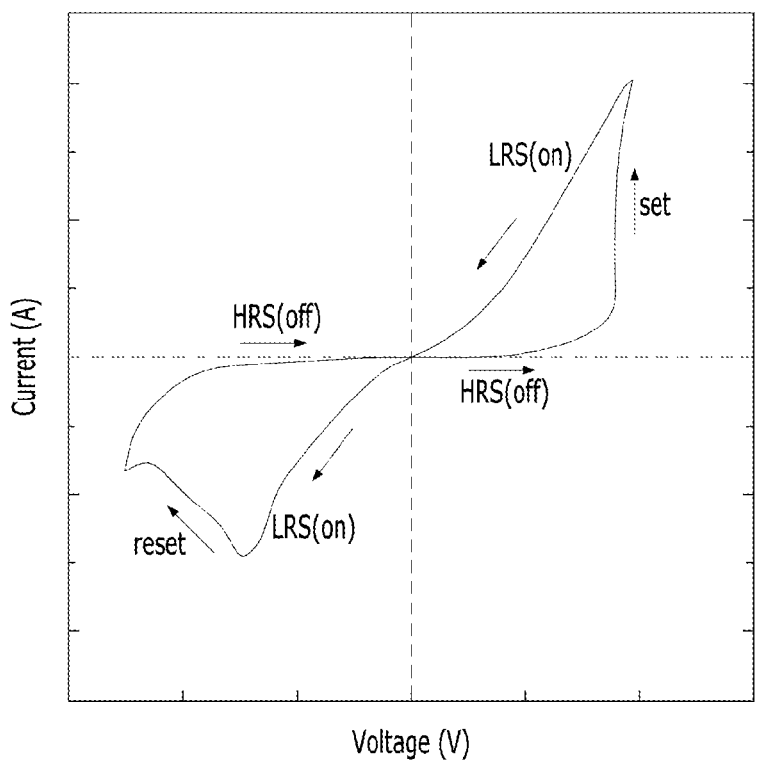
Figure 1C:
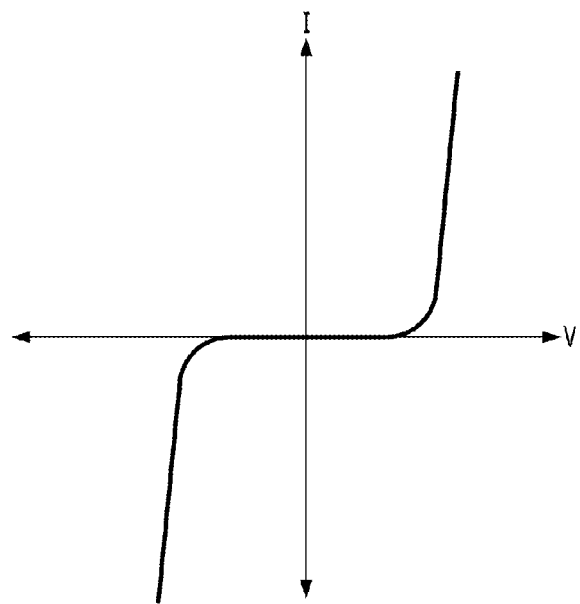
Figure 1D:
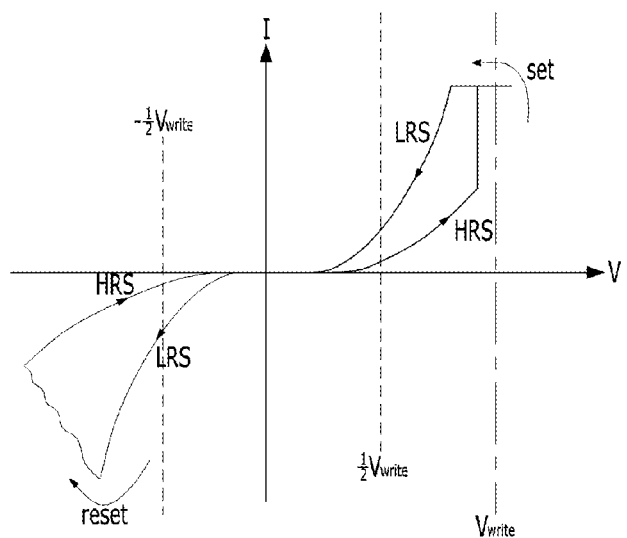
Figure 1E:
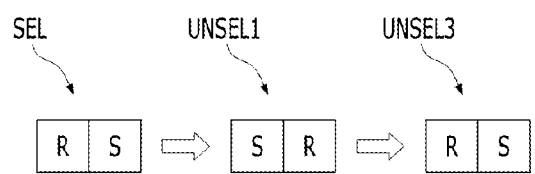

FIGS. 1A to 1E illustrate a memory device and a method for operating the same. FIG. 1A is a perspective view illustrating a memory device including a plurality of memory cells, FIG. 1B is a graph illustrating a current-voltage characteristic of a variable resistance element of a memory cell shown in FIG. 1A, FIG. 1C is a graph illustrating a current-voltage characteristic of a selection element of a memory cell shown in FIG. 1A, FIG. 1D is a graph illustrating a current-voltage characteristic of a memory cell of FIG. 1A, and FIG. 1E illustrates a sneak current path generated in the memory device of FIG. 1A.

Referring to FIG. 1A, the memory device includes a plurality of first lines L1, a plurality of second lines L2, and a plurality of memory cells MC. The first lines L1 extend in a first direction. The second lines L2 extend in a second direction crossing the first direction and are disposed over the first lines L1. The memory cells MC are disposed at intersections of the first lines L1 and the second lines L2. The memory cells MC, which are disposed at intersections of the first lines L1 and the second lines L2, are disposed between the first lines L1 and the second lines L2 in a direction that is perpendicular to the first and second directions, e.g., in a vertical direction.

Each of the memory cells MC includes a stacked structure of a selection element S and a variable resistance element R. The selection element S and the variable resistance element R are connected to each other in series between the first line L1 and the second line L2. In FIG. 1A, the variable resistance element R is disposed over the selection element S, but the positions of the variable resistance element R and the selection element S may be reversed, i.e., the selection element S may be disposed over the variable resistance element R.

The variable resistance element R may switch between different resistance states depending on a voltage or current supplied to the ends thereof through the first and second lines L1 and L2. A current-voltage characteristic of the variable resistance element R is illustrated in FIG. 1B. FIG. 1B shows a current-voltage characteristic when there is only a variable resistance element R and no selection element S.

Referring to FIG. 1B, if the voltage supplied to the variable resistance element R through the first and second lines L1 and L2 is increased to a certain positive voltage having a predetermined positive voltage level, while the variable resistance element R is in a high resistance state HRS, a set operation is performed. As a result, the resistance state of the variable resistance element R is changed from the high resistance state HRS to a low resistance state LRS. The certain positive voltage may be referred to as a 'set' voltage.

The low resistance state LRS of the variable resistance element R may be maintained until a voltage supplied to the variable resistance element R is decreased to a certain negative voltage having a predetermined negative voltage level. If the voltage supplied to the variable resistance element R is decreased to the certain negative voltage, a reset operation in which the resistance state of the variable resistance element R is changed from the low resistance state LRS to the high resistance state HRS is performed. The certain negative voltage may be referred to as a 'reset' voltage.

Since a polarity of the set voltage for performing the set operation is different from a polarity of the reset voltage for performing the reset operation, it may be said that the variable resistance element R has a bipolar switching characteristic. FIG. 1B illustrates that the set operation is performed at a positive voltage and the reset operation is performed at a negative voltage. However, the set operation may be performed at a negative voltage, and the reset operation may be performed at a positive voltage.

Meanwhile, in order to prevent a sneak current, the selection element S having a non-linear current-voltage characteristic may be connected to an end of the variable resistance element R. The current-voltage characteristic of the selection element S is illustrated in FIG. 1C. FIG. 1C shows a current-voltage characteristic when there is only a selection element S and no variable resistance element R.

Referring to FIG. 1C, the selection element S blocks a current flow in a voltage range in which the absolute value of the voltage supplied to the selection element S is equal to or smaller than a certain threshold value, and allows a current, which increases in proportion to the absolute value of the voltage applied thereto, to flow bidirectionally when the absolute value of the voltage is larger than the threshold value. The absolute value of a current flowing at a certain positive voltage may be substantially the same as the absolute value of a current flowing at a corresponding negative voltage. The corresponding negative voltage has substantially the same absolute value as that of the certain positive voltage.

FIG. 1D shows a current-voltage characteristic of the memory cell MC in which the variable resistance element R having the current-voltage characteristic shown in FIG. 1B and the selection element S having the current-voltage characteristic shown in FIG. 1C are connected to each other in series.

Referring to FIG. 1D, similar to the variable resistance element R having the current-voltage characteristic shown in FIG. 1B, the memory cell MC switches between a high resistance state HRS and a low resistance state LRS. However, unlike in the variable resistance element R, there is a voltage range in which a current flow is blocked even if the variable resistance element R is in the low resistance state LRS. In this voltage range, the selection element S blocks a current flow even if the variable resistance element R is in the low resistance state LRS. Therefore, when the selection element S is employed, a sneak current is expected to be blocked by the selection element S in a memory device having a cross-point structure, such as that shown in FIG. 1A.

However, the selection element S may not completely block the sneak current.

Referring to FIGS. 1A, 1D and 1E, when a write voltage Vwrite is applied to perform a set operation in a selected memory cell SEL so that a resistance state of the selected memory cell SEL changes from the high resistance state HRS to the low resistance state LRS, $-\frac{1}{2}$Vwrite and $\frac{1}{2}$Vwrite may be applied to a first line L1 and a second line L2, respectively, which are coupled to the selected memory cell SEL. The write voltage Vwrite may be a positive voltage. In the meantime, a ground voltage may be applied to first and second lines L1 and L2 that are not coupled to the selected memory cell SEL, i.e., first and second lines L1 and L2 coupled to unselected memory cells, or the first and second lines L1 and L2 coupled to unselected memory cells may be floated.

However, even in this case, $-\frac{1}{2}$Vwrite or $\frac{1}{2}$Vwrite is applied to unselected memory cells UNSEL1 and UNSEL2, which share the first line L1 or the second line L2 with the selected memory cell SEL. In this case, it is assumed that the unselected memory cells UNSEL1 and UNSEL2 are in the low resistance state LRS and the high resistance state HRS, respectively. When $-\frac{1}{2}$Vwrite or $\frac{1}{2}$Vwrite is applied to the unselected memory cell UNSEL2 that is in the high resistance state HRS, there is no sneak current problem because a small current flows in the unselected memory cell UNSEL2, as shown in the curve of the high resistance state HRS of FIG. 1D. On the other hand, when $-\frac{1}{2}$Vwrite or $\frac{1}{2}$Vwrite is applied to the unselected memory cell UNSEL1 that is in the low resistance state LRS, a large current flows in the unselected memory cell UNSEL1, as shown in the curve of the low resistance state LRS of FIG. 1D. Therefore, as represented by the dotted line in FIG. 1A, while a small sneak current passes through the unselected memory cell UNSEL2 in the high resistance state HRS, a large sneak current passes through the unselected memory cell UNSEL1 in the low resistance state LRS. As a result, a large sneak current may flow in the entire memory device through another unselected memory cell UNSEL3 that shares a second line L2 with the unselected memory cell UNSEL1 and is in the low resistance state LRS.

FIG. 1E shows a sneak current path from the selected memory cell SEL to the unselected memory cells UNSEL1 and UNSEL3. Referring to FIGS. 1A and 1E, the sneak current flows in order of a variable resistance element R of the selected memory cell SEL, a selection element S of the selected memory cell SEL, a selection element S of the unselected memory cell UNSEL1, which is in the low resistance state LRS and shares the first line L1 with the selected memory cell SEL, a variable resistance element R of the unselected memory cell UNSEL1, a variable resistance element R of the unselected memory cell UNSEL3, which is in the low resistance state LRS and shares the second line L2 with the unselected memory cell UNSEL1, and a selection element S of the unselected memory cell UNSEL3.

As described above, even though a selection element S is employed in a memory cell, the selection element S is unable to completely prevent a sneak current from flowing in the memory device shown in FIG. 1A.

Embodiments of the present disclosure are directed to a memory device having an improved sneak current blocking characteristic.

FIGS. 2A to 2F show an embodiment in which the absolute value of a set current, which flows at a set voltage for performing a set operation of a variable resistance element, is larger than the absolute value of a reset current, which flows at a corresponding reset voltage for performing a reset operation of the variable resistance element. On the other hand, FIGS. 3A to 3D show an embodiment in which the absolute value of the reset current is larger than the absolute value of the set current. The embodiment of FIGS. 2A to 2F reduces a sneak current in the set operation, and the embodiment of FIGS. 3A to 3D reduces a sneak current in the reset operation.

Figure 2A:
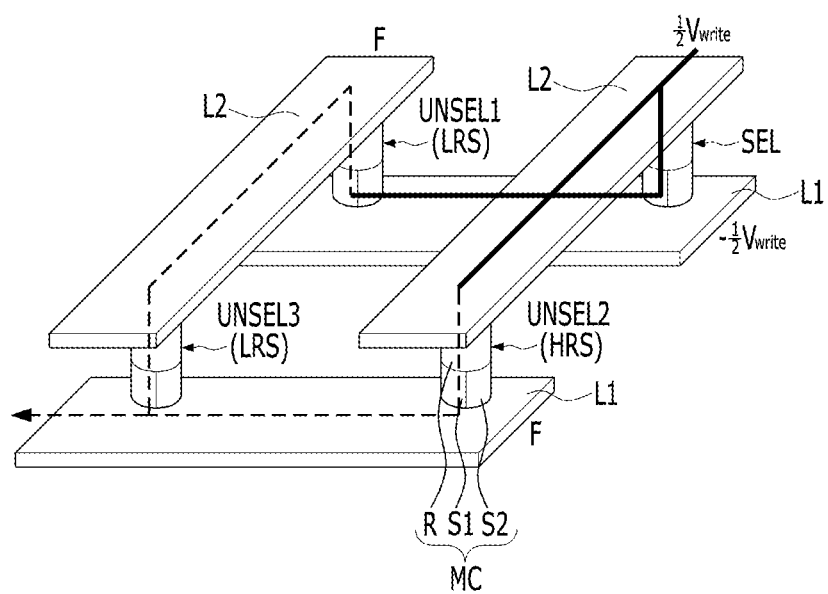
FIGS. 2A to 2F are views illustrating a memory device and a method for operating the same in accordance with an embodiment of the present disclosure.
Figure 2B:
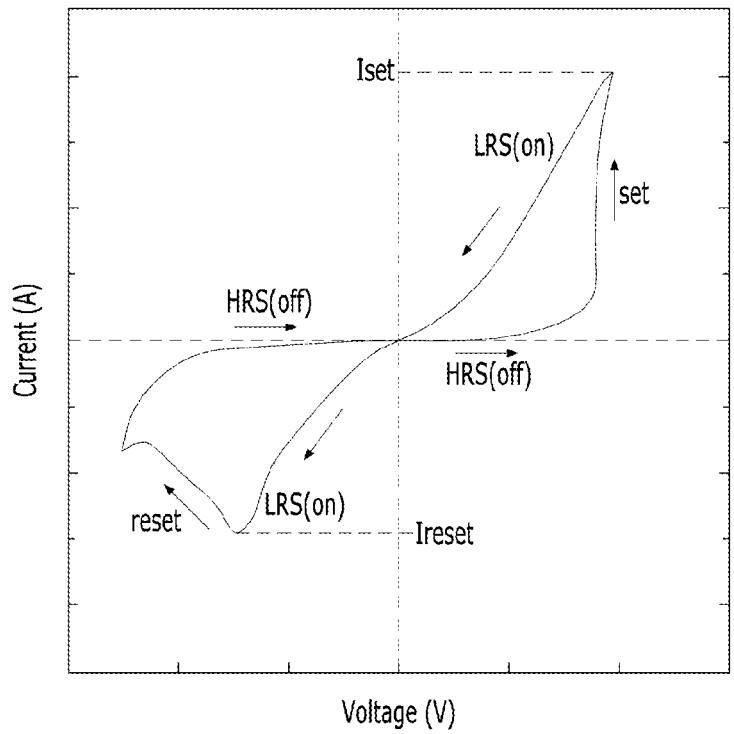
Figure 2C:
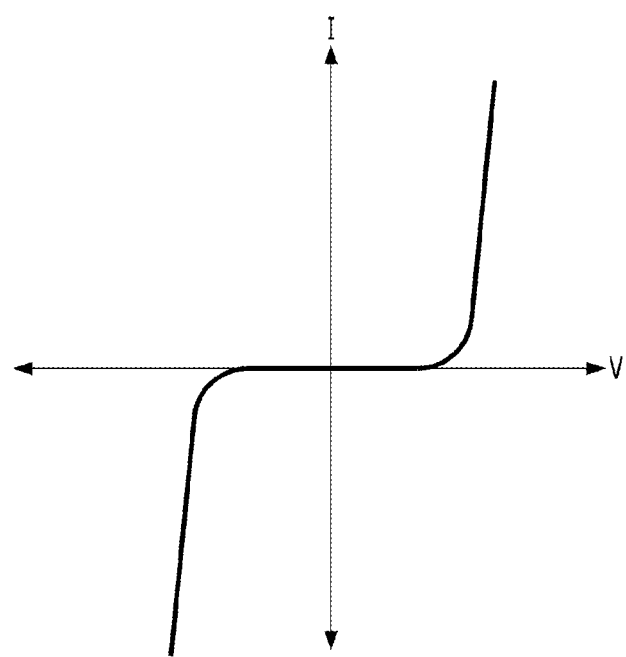
Figure 2D:
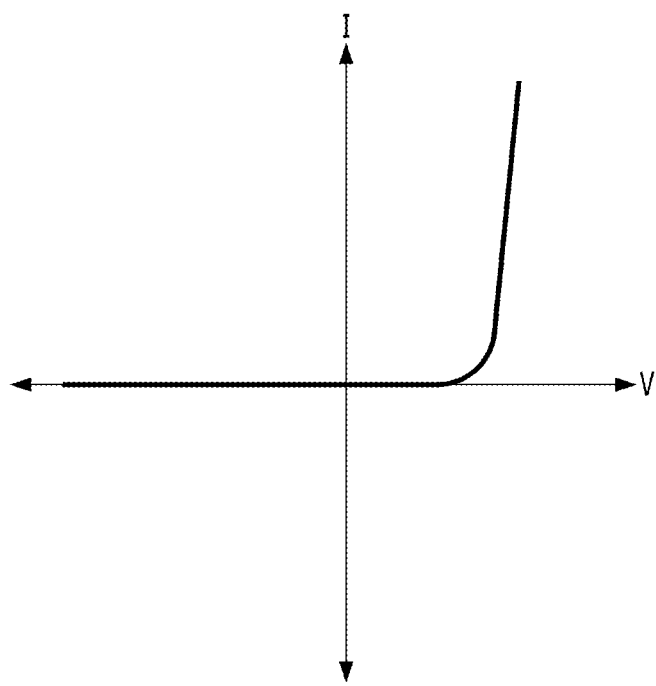
Figure 2E:
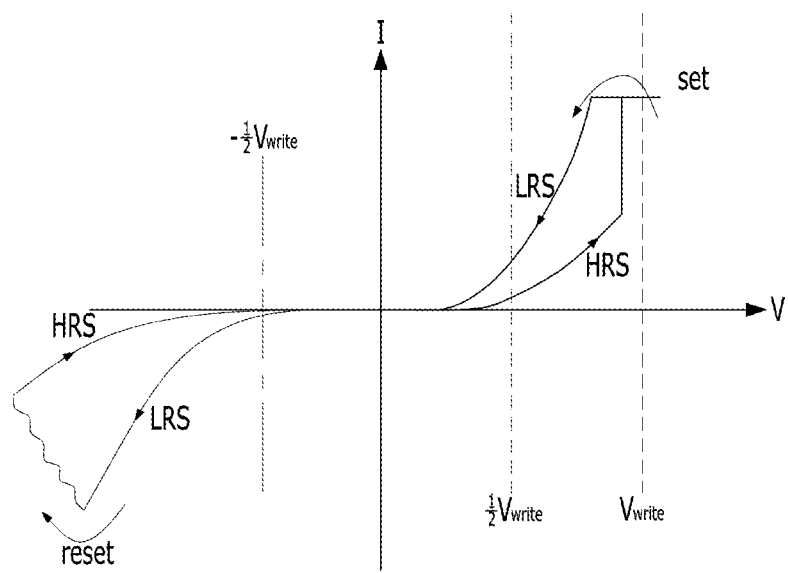
Figure 2F:
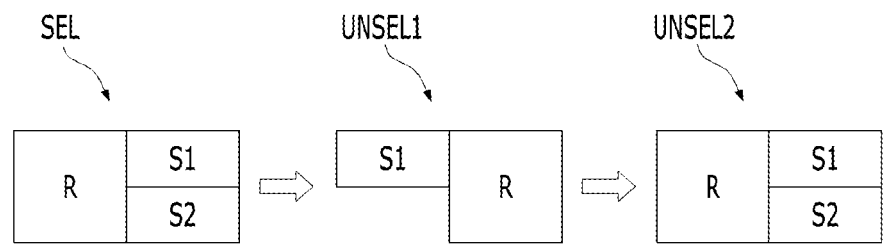

FIGS. 2A to 2F illustrate a memory device and a method for operating the same in accordance with an embodiment of the present disclosure. FIG. 2A is a perspective view illustrating a memory device including a plurality of memory cells, FIG. 2B is a graph illustrating a current-voltage characteristic of a variable resistance element of a memory cell shown in FIG. 2A, FIG. 2C is a graph illustrating a current-voltage characteristic of a first selection element of a memory cell shown in FIG. 2A, FIG. 2D is a graph illustrating a current-voltage characteristic of a second selection element of a memory cell shown in FIG. 2A, FIG. 2E is a graph illustrating a current-voltage characteristic of a memory cell of FIG. 2A, and FIG. 2F illustrates a sneak current path generated in the memory device of FIG. 2A.

Referring to FIG. 2A, the memory device includes a plurality of first lines L1, a plurality of second lines L2, and a plurality of memory cells MC. The first lines L1 extend in a first direction. The second lines L2 extend in a second direction crossing the first direction and are disposed over the first lines L1. The memory cells MC are disposed at intersections of the first lines L1 and the second lines L2. The memory cells MC are disposed between the first lines L1 and the second lines L2 in a direction that is perpendicular to the first and second directions, e.g., a vertical direction in the orientation of FIG. 2A.

Each of the memory cells MC includes a stacked structure of a selection element and a variable resistance element R. The selection element includes a first selection element S1 and a second selection element S2 that are disposed side by side. Each of the first and second selection elements S1 and S2 includes one end, for example, an upper end, which is coupled to the variable resistance element R and another end, for example, a lower end, which is coupled to a corresponding first line L1. In other words, each of the first and second selection elements S1 and S2 is coupled to the variable resistance element R in series in the vertical direction, and the first selection element S1 and the second selection element S2 are connected to each other in parallel in the vertical direction.

In the embodiment shown in FIG. 2A, the variable resistance element R is disposed over the first and second selection elements S1 and S2. However, in another embodiment, the positions of the variable resistance element R and the first and second selection elements S1 and S2 may be reversed. That is, the first and second selection elements S1 and S2 are disposed over the variable resistance element R and have upper ends coupled to a corresponding second line L2 and lower ends coupled to the variable resistance element R.

The first and second lines L1 and L2 may supply a voltage or current to the memory cell MC. Each of the first and second lines L1 and L2 may have a single-layered structure or a multi-layered structure including one or more conductive materials. The conductive materials may include a metal, such as Pt, Ir, Ru, Al, Cu, W, Ti, Ta, Co, Ni, or the like, a metal nitride, such as TiN, TiCN, TiAlN, TiON, TaN, TaCN, TaAlN, TaON, WN, MoN, and so on.

The variable resistance element R may switch between different resistance states depending on a voltage or current supplied thereto through the first and second lines L1 and L2. The variable resistance element R may have a single-layered structure or a multi-layered structure including one or more of materials that are used for an RRAM, a PRAM, an FRAM, an MRAM, and so on. The materials may include a metal oxide, such as a transition metal oxide, a perovskite-based material, or the like, a phase change material such as a chalcogenide-based material, a ferroelectric material, a ferromagnetic material, and so on. A current-voltage characteristic of the variable resistance element R is illustrated in FIG. 2B.

Referring to FIG. 2B, if the voltage supplied to the variable resistance element R through the first and second lines L1 and L2 is increased to a certain positive voltage having a predetermined positive voltage level while the variable resistance element R is in a high resistance state HRS, a set operation is performed. As a result, the resistance state of the variable resistance element R is changed from the high resistance state HRS to a low resistance state LRS. The certain positive voltage may be referred to as a set voltage, and a current flowing at the set voltage may be referred to as a set current Iset.

The low resistance state LRS of the variable resistance element R may be maintained until the voltage supplied to the variable resistance element R is decreased to a certain negative voltage having a predetermined negative voltage level. If the voltage supplied to the variable resistance element R is decreased to the certain negative voltage, a reset operation in which the resistance state of the variable resistance element R is changed from the low resistance state LRS to the high resistance state HRS is performed. The certain negative voltage may be referred to as a reset voltage, and a current flowing at the reset voltage may be referred to as a reset current Ireset.

In an embodiment, the absolute value of the set current Iset at a certain positive voltage is larger than the absolute value of the reset current Ireset at a corresponding negative voltage. In an embodiment, the set operation is performed at a positive voltage, and the reset operation is performed at a negative voltage. However, in another embodiment, the set operation is performed at a negative voltage, and the reset operation is performed at a positive voltage.

The first and second selection elements S1 and S2 may have a non-linear current-voltage characteristic. The first selection element S1 may allow a bidirectional current flow, and the second selection element S2 may allow a unidirectional current flow. Current-voltage characteristics of the first and second selection element S1 and S2 are illustrated in FIGS. 2C and 2D, respectively.

Referring to FIG. 2C, the first selection element S1 blocks a current flow in a voltage range in which the absolute value of a voltage supplied to the first selection element S1 is equal to or smaller than a certain threshold value, and allows a current, which increases in proportion to the absolute value of the voltage applied thereto, to flow bidirectionally when the absolute value of the voltage is larger than the threshold value. The absolute value of a current flowing at a certain positive voltage may be substantially the same as the absolute value of a current flowing at a certain corresponding negative voltage. The corresponding negative voltage has substantially the same absolute value as that of the certain positive voltage.

The first selection element S1 may include one or more of a MIT (Metal Insulator Transition) element such as $NbO_2$, $TiO_2$, or the like, a MIEC (Mixed Ion-Electron Conducting) element such as $ZrO_2(Y_2O_3)$, $Bi_2O_3$—BaO, $(La_2O_3) \times (CeO_2)$ 1–x, or the like, and an OTS (Ovonic Threshold Switching) element including a chalcogenide-based material such as $e_2Sb_2Te_5$, $As_2Te_3$, $As_2$, $As_2Se_3$, or the like.

Referring to FIG. 2D, the second selection element S2 allows a current to flow only at a voltage having the same polarity as the set voltage.

When the set voltage is a positive voltage, the second selection element S2 blocks a current flow if a negative voltage is supplied to the second selection element S2 or if a positive voltage having an absolute value that is equal to or smaller than a certain threshold value is supplied to the second selection element S2, and allows a current, which increases in proportion to the absolute value of the positive voltage, to flow if the absolute value of the positive voltage is larger than the threshold value. For a positive voltage, the second selection element S2 may have substantially the same current-voltage characteristic as the first selection element S1.

On the other hand, when the set voltage is a negative voltage, the second selection element S2 blocks a current flow if a positive voltage is supplied to the second selection element S2 or if a negative voltage having an absolute value that is equal to or smaller than a certain threshold value is supplied to the second selection element S2, and allows a current, which increases in proportion to the absolute value of the negative voltage, to flow if the absolute value of the negative voltage is larger than the threshold value. When the set voltage is a negative voltage, the second selection element S2 may have substantially the same current-voltage characteristic as shown in FIG. 3C, which will be described later.

The second selection element S2 may include one of a silicon-based diode such as a P—N diode, a schottky diode formed by combining an oxide semiconductor with a metal electrode having a work function different from the oxide semiconductor, such as a stacked structure of $Pt/TiO_2/Al$, and so on.

FIG. 2E shows a current-voltage characteristic of a memory cell MC in which the variable resistance element R having the current-voltage characteristic shown in FIG. 2B, the first selection element S1 having the current-voltage characteristic shown in FIG. 2C and the second selection element S2 having the current-voltage characteristic shown in FIG. 2D are combined.

Referring to FIG. 2E, for a positive voltage, the current-voltage curve of the memory cell MC is substantially the same as the current-voltage curve of the memory cell MC of FIG. 1D. On the other hand, for a negative voltage, the current-voltage curve of the memory cell MC is shifted to the left compared to the current-voltage curve of the memory cell MC of FIG. 1D. That is, a negative voltage range in which a current flow is blocked may be increased compared to that shown in FIG. 1D.

As a result, in this embodiment, a sneak current blocking effect may be improved during the set operation, compared to the memory device of FIGS. 1A to 1E.

Referring to FIGS. 2A, 2E and 2F, when a write voltage Vwrite is used to perform a set operation in a selected memory cell SEL so that a resistance state of the selected memory cell SEL is changed from a high resistance state HRS to a low resistance state LRS, −½Vwrite and ½Vwrite may be applied to a first line L1 and a second line L2, respectively, which are coupled to the selected memory cell SEL. A ground voltage may be applied to first and second lines L1 and L2, which are not coupled to the selected memory cell SEL, i.e., first and second lines L1 and L2 coupled to unselected memory cells, or the first and second lines L1 and L2 coupled to the unselected memory cell SEL may be floated.

However, even in this case, −½Vwrite or ½Vwrite may be also applied to unselected memory cells UNSEL1 and UNSEL2, which share the first line L1 or the second line L2 with the selected memory cell SEL. For example, when −½Vwrite is applied to the unselected memory cell UNSEL1, which shares the first line L1 with the selected memory cell SEL, through the first line L1, a small current flows in the unselected memory cell UNSEL1 although the unselected memory cell UNSEL1 is in the low resistance state LRS, since the unselected memory cell UNSEL1 has the current-voltage characteristic shown in FIG. 2E.

When a positive voltage such as the write voltage Vwrite is applied to a memory cell MC, both the first selection element S1 and the second selection element S2 of the memory cell MC may be turned on to allow a current to flow in a direction from the variable resistance element R to the first and second selection elements S1 and S2 (hereinafter, referred to as a 'forward' direction). On the other hand, when a negative voltage such as −½Vwrite is applied to the memory cell MC, the first selection element S1 may be turned on while the second selection element S2 is turned off. Therefore, a current, which is smaller than the current flowing in the forward direction, flows in a direction from the first and second selection elements S1 and S2 to the variable resistance element R (hereinafter, referred to as a 'reverse' direction) since a current flowing through the second selection element S2 is blocked in the reverse direction. That is, since the first and second selection elements S1 and S2 are selectively turned on depending on a polarity of a voltage supplied thereto, the current flowing in the reverse direction may have an absolute value smaller than that of the current flowing in the forward direction. As a result, as represented by a dotted line in FIG. 2A, both a sneak current passing through the unselected memory cell UNSEL2 in the high resistance state HRS and a sneak current passing through the unselected memory cell UNSEL1 in the low resistance state LRS may be reduced. This is because a current passing through the first and second selection elements S1 and S2 of the unselected memory cell UNSEL1 is reduced by the second selection element S2 that is turned off in the reverse direction.

As a result, a reduced sneak current may flow in the entire memory device. FIG. 2F shows a sneak current path from the selected memory cell SEL to the unselected memory cells UNSEL1 and UNSEL3, which are in the low resistance state LRS. The sneak current flows in order of a variable resistance element R of the selected memory cell SEL, first and second selection elements S1 and S2 of the selected memory cell SEL, a first selection element S1 of the unselected memory cell UNSEL1, which is in the low resistance state LRS and shares the first line L1 with the selected memory cell SEL, a variable resistance element R of the unselected memory cell UNSEL1, a variable resistance element R of the unselected memory cell UNSEL3, which is in the low resistance state LRS and shares the second line L1 with the unselected memory cell UNSEL1, and first and second selection elements S1 and S2 of the unselected memory cell UNSEL3. Since a sneak current passing through the unselected memory cell UNSEL1 is reduced, a sneak current passing through the unselected memory cell UNSEL3 may be also small.

Meanwhile, in the reset operation, a voltage having a polarity that is opposite to a polarity of the set voltage is supplied to the first and second lines L1 and L2. In an embodiment, a positive voltage is applied to the first line L1, and a negative voltage is applied to the second line L2. In this case, the first and second selection elements S1 and S2 may not reduce a current flowing in the reverse direction. However, a sneak current problem does not occur because the reset current is smaller than the set current.

The embodiment described above relates to a case in which the set current is larger than the reset current, and a sneak current is reduced in the set operation because a sneak current generated in the set operation is larger than a sneak current generated in the reset operation.

Figure 3A:
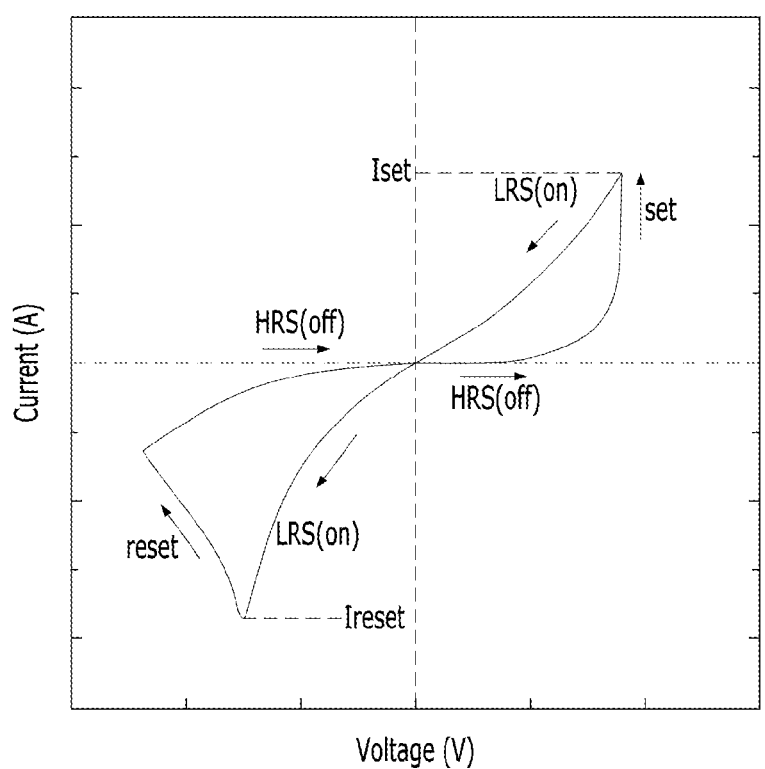
FIGS. 3A to 3D are views illustrating a memory device and a method for operating the same in accordance with another embodiment of the present disclosure.
Figure 3B:
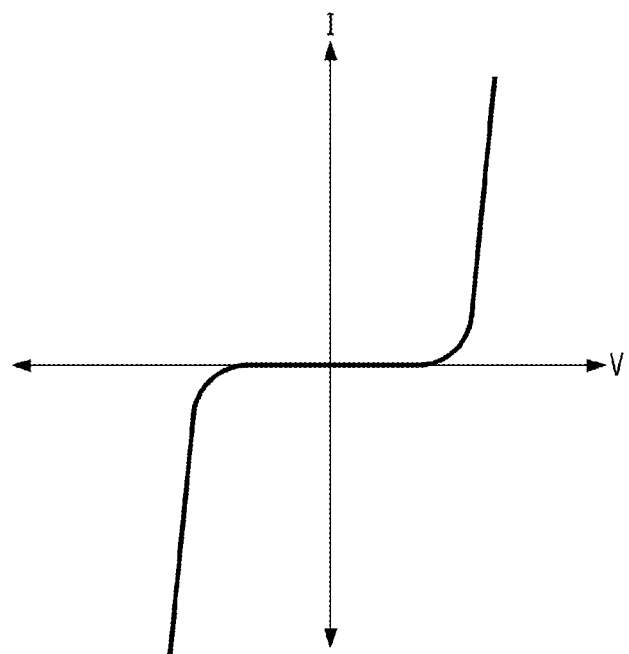
Figure 3C:
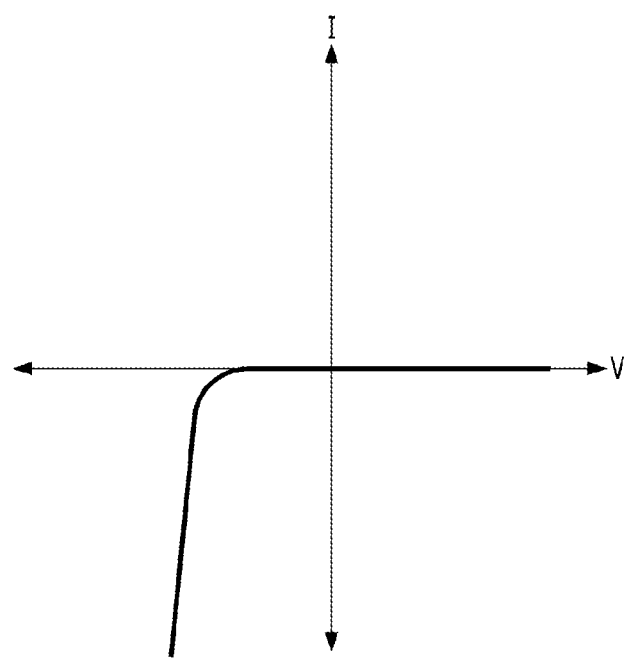
Figure 3D:
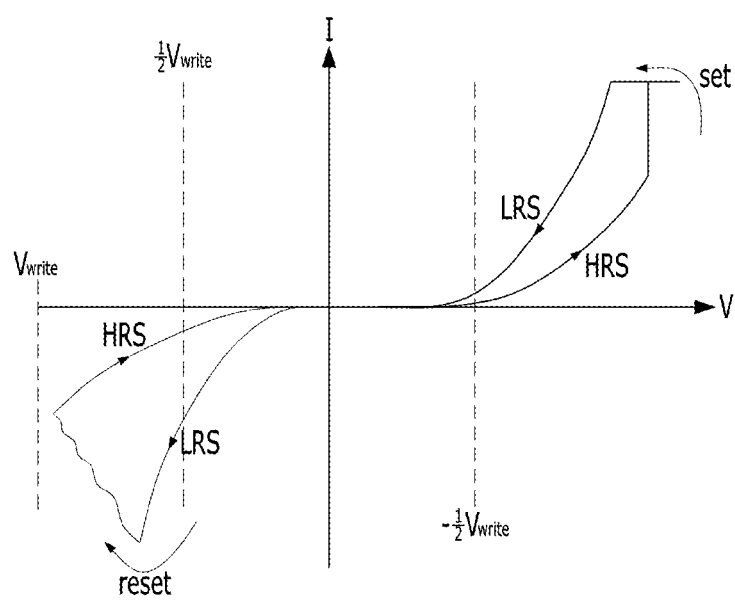

FIGS. 3A to 3D illustrate a memory device and a method for operating the same in accordance with another embodiment of the present disclosure. The memory device of this embodiment has substantially the same configuration as that of the memory device of FIG. 2A. FIG. 3A is a graph illustrating a current-voltage characteristic of a variable resistance element R, FIG. 3B is a graph illustrating a current-voltage characteristic of a first selection element S1, FIG. 3C is a graph illustrating a current-voltage characteristic of a second selection element S2, and FIG. 3D is a graph illustrating a current-voltage characteristic of a memory cell MC including the variable resistance element R and the first and second selection elements S1 and S2. For convenience of description, differences between the embodiment of FIGS. 3A to 3D and FIGS. 2A to 2F will primarily be described hereinafter.

Referring to FIG. 3A, unlike the embodiment of FIGS. 2A to 2F, a set current Iset of the variable resistance element R is smaller than a reset current Ireset.

Referring to FIG. 3B, like the embodiment of FIGS. 2A to 2F, the first selection element S1 allows a bidirectional current flow.

Referring to FIG. 3C, unlike the embodiment of FIGS. 2A to 2F, the second selection element S2 allows a current to flow only at a voltage having the same polarity as the reset voltage. When the reset voltage is a negative voltage like the embodiment of FIGS. 2A to 2F, the second selection element S2 blocks a current flow if a positive voltage is supplied to the second selection element S2 or if a negative voltage having an absolute value that is equal to or smaller than a certain threshold value is supplied to the second selection element S2, and allows a current, which is increasing in proportion to the absolute value of the negative voltage, to flow if the absolute value of the negative voltage is larger than the threshold value. That is, for a negative voltage, the second selection element S2 has substantially the same current-voltage characteristic as the first selection element S1.

On the other hand, when the reset voltage is a positive voltage, the second selection element S2 blocks a current flow if a negative voltage is supplied to the second selection element S2 or if a positive voltage having an absolute value that is equal to or smaller than a certain threshold value is supplied to the second selection element S2, and allows a current, which is increasing in proportion to the absolute value of the positive voltage, to flow if the absolute value of the positive voltage is larger than the threshold value. That is, for a positive voltage, the second selection element S2 has substantially the same current-voltage characteristic as the current-voltage characteristic shown in FIG. 2D.

FIG. 3D shows a current-voltage characteristic of the memory cell MC in which the variable resistance element R having the current-voltage characteristic shown in FIG. 3A, the first selection element S1 having the current-voltage characteristic shown in FIG. 3B and the second selection element S2 having the current-voltage characteristic shown in FIG. 3C are combined.

Referring to FIG. 3D, for a negative voltage, the current-voltage curve of the memory cell MC is substantially the same as the current-voltage curve of the memory cell MC shown in FIG. 1D. On the other hand, for a positive voltage, the current-voltage curve of the memory cell MC is shifted to the right compared to the current-voltage curve of the memory cell MC shown in FIG. 1D. Therefore, the positive voltage range in which a current flow is blocked may be increased compared to the positive voltage range that is blocked in FIG. 1D.

In this embodiment, a sneak current blocking effect may be improved during the reset operation, compared to the memory device of FIGS. 1A to 1E.

Referring again to FIG. 3D, when a write voltage Vwrite is applied to perform the reset operation in a selected memory cell SEL such that a resistance state of the selected memory cell SEL is changed from a low resistance state LRS to a high resistance state HRS, −½Vwrite and ½Vwrite may be applied to a first line L1 and a second line L2, respectively, which are coupled to the selected memory cell SEL. The write voltage Vwrite may be a negative voltage. A ground voltage may be applied to first and second lines L1 and L2 that are not coupled to the selected memory cell SEL, i.e., first and second lines L1 and L2 coupled to unselected memory cells, or the first and second lines L1 and L2 coupled to the unselected memory cells may be floated.

However, even in this case, −½Vwrite or ½Vwrite may be also applied to unselected memory cells UNSEL1 and UNSEL2, which share the first line L1 or the second line L2 with the selected memory cell SEL. For example, when −½Vwrite is applied to the unselected memory cell UNSEL1, which shares the first line L1 with the selected memory cell SEL, through the first line L1, a small current flows in the unselected memory cell UNSEL1 even though the unselected memory cell UNSEL1 is in the low resistance state LRS since the unselected memory cell UNSEL1 has the current-voltage characteristic shown in FIG. 3D.

When a negative voltage such as the write voltage Vwrite is applied to a memory cell MC, both the first selection element S1 and the second selection element S2 may be turned on to allow a current to flow in a forward direction from the variable resistance element R to the first and second selection elements S1 and S2. On the other hand, when a positive voltage such as −½Vwrite is applied to the memory cell MC, the first selection element S1 may be turned on while the second selection element S2 is turned off. Therefore, a current smaller than the current flowing in the forward direction flows in a reverse direction from the first and second selection elements S1 an S2 to the variable resistance element R since a current flowing through the second selection element S2 is blocked. That is, since the first and second selection elements S1 and S2 are selectively turned on depending on the polarity of the voltage supplied thereto, the current flowing in the reverse direction may have an absolute value smaller than that of the current flowing in the forward direction. As a result, a sneak current flowing through the memory device is reduced in the reset operation. A sneak current path in the memory device of this embodiment may be substantially the same as that of FIG. 2F.

Meanwhile, in the set operation, a voltage having a polarity that is opposite to a polarity of the reset voltage is supplied to the first and second lines L1 and L2. In an embodiment, a negative voltage is applied to the first line L1, and a positive voltage is applied to the second line L2. In this case, the first and second selection elements S1 and S2 may not reduce a current flowing in the reverse direction. However, a sneak current problem does not occur because the set current is smaller than the reset current. As described above, in the embodiment, if the reset current is larger than the set current, a sneak current in the reset operation is reduced because a sneak current generated in the reset operation is larger than a sneak current generated in the set operation.

In the above embodiments, the first selection element S1 allows a current to flow in the forward direction and the reverse direction, and the second selection element S2 allows a current to flow in a direction from the variable resistance element R to the first and second selection elements S1 and S2 while blocking a current flow in a direction from the first and second selection elements S1 and S2 to the variable resistance element R. Furthermore, the second selection element S2 allows a current to flow only at a selected one of a positive voltage and a negative voltage depending on polarities of the set voltage and the reset voltage or relative absolute values of the set current and the reset current.

The above and other memory circuits or semiconductor devices based on the disclosed technology can be used in a range of devices or systems. FIGS. 4-8 provide some examples of devices or systems that can implement the memory circuits disclosed herein.

Figure 4:
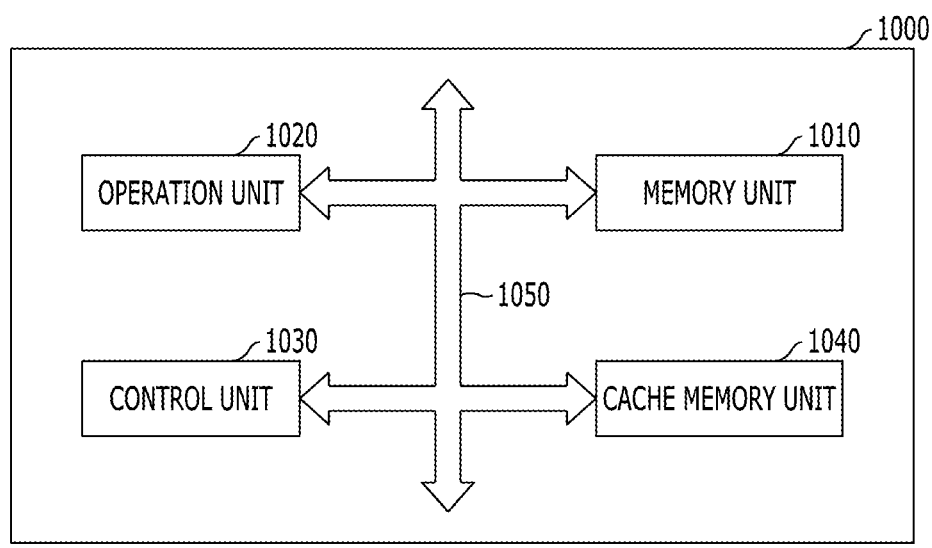
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the memory unit 1010 may implement a cross-point structure and reduce a sneak current. As a consequence, a size of the microprocessor 1000 may be reduced and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
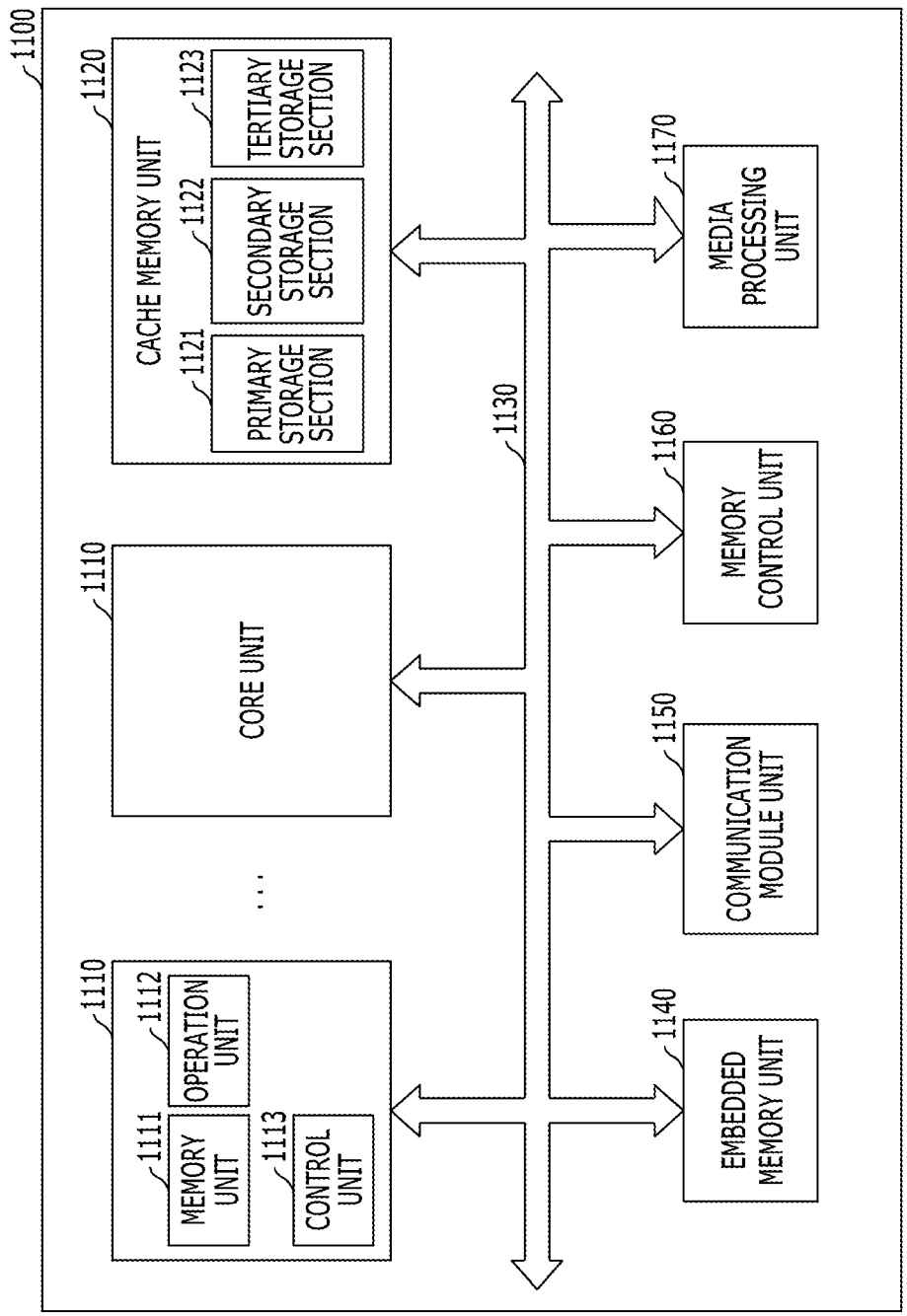
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the cache memory unit 1120 may implement a cross-point structure and reduce a sneak current. As a consequence, a size of the processor 1100 may be reduced and performance characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
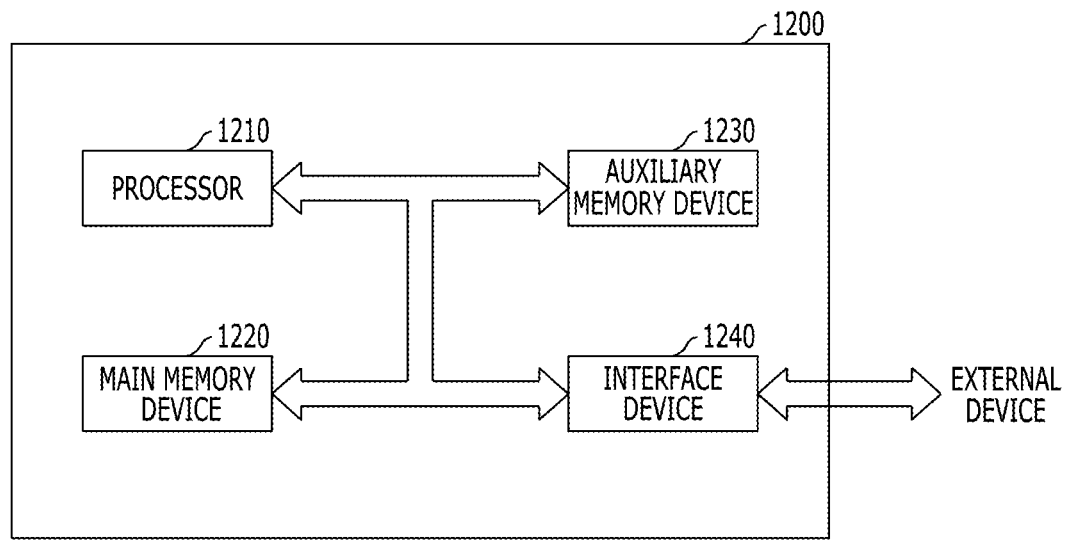
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the main memory device 1220 may implement a cross-point structure and reduce a sneak current. As a consequence, a size of the system 1200 may be reduced and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the auxiliary memory device 1230 may implement a cross-point structure and reduce a sneak current. As a consequence, a size of the system 1200 may be reduced and performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
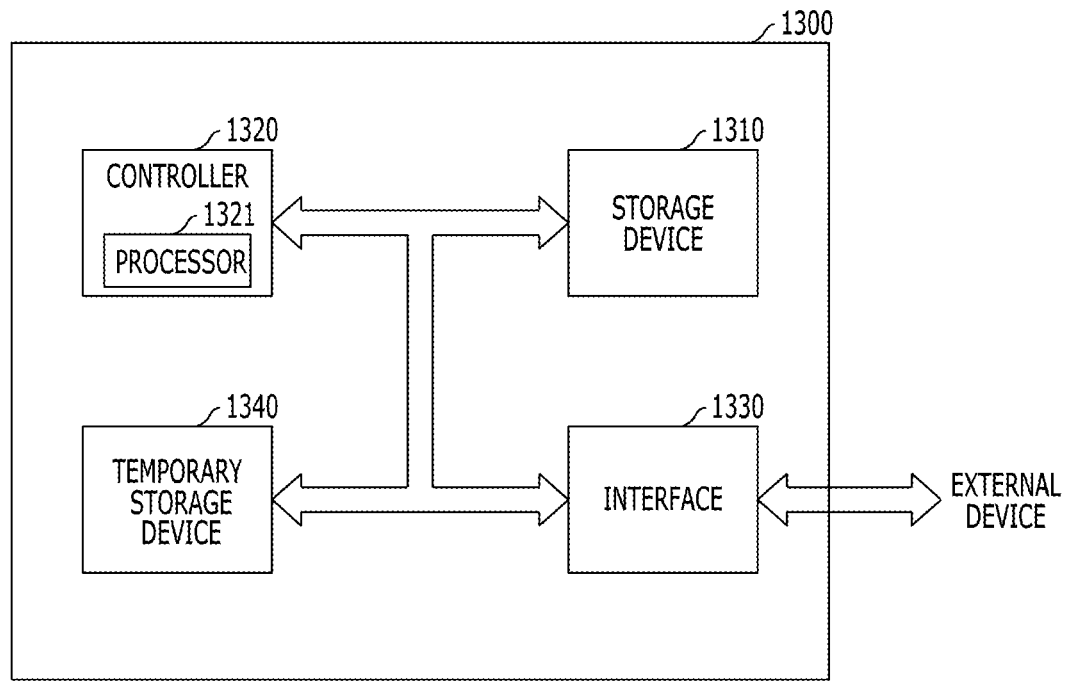
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the temporary storage device 1340 may implement a cross-point structure and reduce a sneak current. As a consequence, a size of the data storage system 1300 may be reduced and performance characteristics of the data storage system 1300 may be improved.

Figure 8:
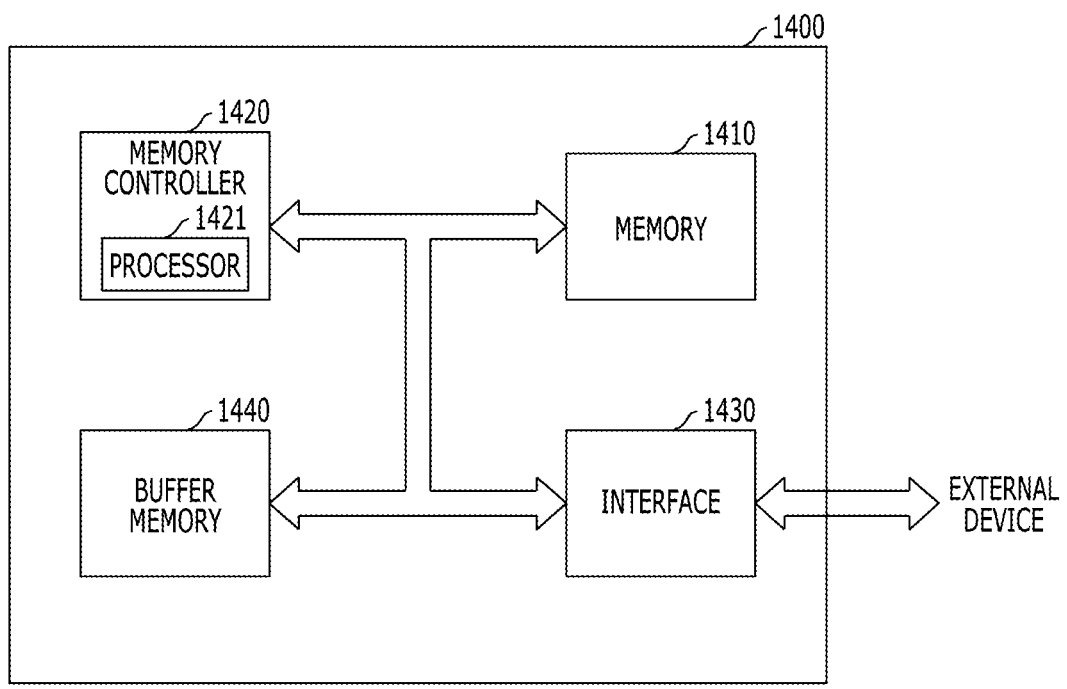
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the memory 1410 may implement a cross-point structure and reduce a sneak current. As a consequence, a size of the memory system 1400 may be reduced and performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of first lines extending in a first direction; a plurality of second lines extending in a second direction crossing the first direction; and a plurality of memory cells provided between the first lines and the second lines and disposed at intersections of the first lines and the second lines, respectively, wherein each of the memory cells comprises: a variable resistance element coupled to and disposed between a corresponding second line and first and second selection elements; the first selection element coupled to and disposed between the variable resistance element and a corresponding first line, and allowing a bidirectional current flow therethrough; and the second selection element coupled to and disposed between the variable resistance element and the corresponding first line, and allowing a unidirectional current flow therethrough. Through this, the buffer memory 1440 may implement a cross-point structure and reduce a sneak current. As a consequence, a size of the memory system 1400 may be reduced and performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

An electronic device in accordance with the implementations of the present disclosure may provide a memory device which has a cross-point structure and a reduced sneak current.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit, wherein the semiconductor memory unit comprises:
    first lines extending in a first direction;
    second lines extending in a second direction crossing the first direction; and
    memory cells provided between the first lines and the second lines and disposed at intersections of the first lines and the second lines, respectively,
    wherein each of the memory cells comprises:
        a variable resistance element coupled to and disposed between a corresponding second line and first and second selection elements, wherein the variable resistance element includes a first surface facing the corresponding second line and a second surface facing the first and second selection elements;
        the first selection element coupled to and disposed between the variable resistance element and a corresponding first line, and allowing a bidirectional current flow therethrough, wherein the first selection element is coupled to a first portion of the second surface of the variable resistance element; and
        the second selection element coupled to and disposed between the variable resistance element and the corresponding first line, and allowing a unidirectional current flow therethrough, wherein the second selection element is coupled to a second portion of the second surface of the variable resistance element, and the first portion is different from the second portion.

2. The electronic device according to claim 1, wherein each of the first and second selection elements is connected with the variable resistance element in series, and
    wherein the first and second selection elements are connected with each other in parallel.

3. The electronic device according to claim 1, wherein, when a direction from the variable resistance element to the first and second selection elements is a forward direction, and a direction from the first and second selection elements to the variable resistance element is a reverse direction,
    the second selection element blocks a current flow in the reverse direction.

4. The electronic device according to claim 3, wherein the first and second selection elements allow a current flow in the forward direction.

5. The electronic device according to claim 1, wherein, when a set voltage and a set current applied during a set operation in which a resistance state of the variable resistance element is changed from a high resistance state to a low resistance state have different polarities from those of a reset voltage and a reset current applied during a reset operation in which the resistance state of the variable resistance element is changed from the low resistance state to the high resistance state, and an absolute value of the set current is larger than that of the reset current, the second selection element allows a current flow only at a voltage having the same polarity as the set voltage.

6. The electronic device according to claim 1, wherein, when a set voltage and a set current applied during a set operation in which a resistance state of the variable resistance element is changed from a high resistance state to a low resistance state have different polarities from those of a reset voltage and a reset current applied during a reset operation in which the resistance state of the variable resistance element is changed from the low resistance state to the high resistance state, and an absolute value of the reset current is larger than that of the set current, the second selection element allows a current flow only at a voltage having the same polarity as the reset voltage.

7. The electronic device according to claim 1, wherein the first selection element includes a MIT (Metal Insulator Transition) element, a MIEC (Mixed Ion-Electron Conducting) element, or an OTS (Ovonic Threshold Switching) element, and wherein the second selection element includes a diode.

8. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

9. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

10. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

11. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

12. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

* * * * *